United States Patent
Huang

(10) Patent No.: US 9,128,324 B2
(45) Date of Patent: Sep. 8, 2015

(54) DISPLAY DEVICE AND OPERATION METHOD THEREOF

(71) Applicant: HannStar Display Corp., New Taipei (TW)

(72) Inventor: Kun-Tsai Huang, Kaohsiung (TW)

(73) Assignee: HANNSTAR DISPLAY CORPORATION, Wugu Dist., New Taipei (TW)

( * ) Notice: Subject to any disclaimer, the term of this patent is extended or adjusted under 35 U.S.C. 154(b) by 196 days.

(21) Appl. No.: 13/751,127

(22) Filed: Jan. 27, 2013

(65) Prior Publication Data

US 2014/0009720 A1    Jan. 9, 2014

(30) Foreign Application Priority Data

Jul. 5, 2012 (CN) .......................... 2012 1 0231026

(51) Int. Cl.
*G02F 1/1335* (2006.01)
*H01L 27/32* (2006.01)

(52) U.S. Cl.
CPC ...... *G02F 1/133603* (2013.01); *H01L 27/3232* (2013.01); *G02F 2201/44* (2013.01)

(58) Field of Classification Search
CPC ............ H01L 27/3244; H01L 27/3209; H01L 27/3241; H01L 51/5012; H01L 51/5287; G09G 3/342; G09G 3/3648; G09G 3/3688; G09G 3/3225; G09G 3/3208; G09G 2300/0426; G09G 2300/0809; G09G 2300/08; G09G 2320/0646; G02B 5/30; G02B 6/0073; G02F 1/1368; G02F 1/133603; G02F 1/1333; G02F 2001/134345; G02F 2203/12; B32B 2457/20; B32B 2457/206
USPC ........ 345/76, 102, 87, 84; 349/61, 139, 43, 1, 349/69, 96, 123, 12, 74, 86, 122; 257/E33.001, E51.018; 362/611, 612, 362/97.1; 40/448
See application file for complete search history.

(56) References Cited

U.S. PATENT DOCUMENTS

| | | | |
|---|---|---|---|
| 5,592,314 A * | 1/1997 | Ogasawara et al. | 349/18 |
| 5,847,787 A * | 12/1998 | Fredley et al. | 349/89 |
| 8,293,595 B2 * | 10/2012 | Yamazaki et al. | 438/158 |
| 2005/0088079 A1 * | 4/2005 | Daniels | 313/504 |
| 2007/0024822 A1 | 2/2007 | Cortenraad | |
| 2009/0244413 A1 | 10/2009 | Ishikawa | |
| 2010/0025675 A1 | 2/2010 | Yamazaki | |

* cited by examiner

*Primary Examiner* — Thoi Duong
(74) *Attorney, Agent, or Firm* — Winston Hsu; Scott Margo

(57) ABSTRACT

A display device includes a transparent display panel and an adjustable light valve. The transparent display panel and the adjustable light valve are disposed opposite to each other. The transparent display panel includes a plurality of pixels including active-matrix organic light-emitting diodes for generating an image. When the display device operates under a transparent display mode, the adjustable light valve is in a transparent status. When the display device operates under a high color saturation display mode, the adjustable light valve is in a non-transparent status. Thereby, the display device will not be limited to having only a display mode.

16 Claims, 9 Drawing Sheets

DISPLAY DEVICE AND OPERATION METHOD THEREOF

BACKGROUND OF THE INVENTION

1. Field of the Invention

The present invention relates to a display device and an operation method thereof, and particularly to a display device including an adjustable light valve to switch display modes and an operation method thereof.

2. Description of the Prior Art

The term "transparent display device" generally refers to a transparent display which can be formed to be in a transparent status so that a viewer can see the images of the scene or objects in back of the display device. The transparent display device is commonly placed in front of exhibits in, for example, a display window for presenting the displaying. Various techniques have been developed for the display panel of the transparent display device. Since active-matrix organic light-emitting diode (AMOLED) display has advantages such as self-luminance, wide view-angle, short response time, high light-emitting efficiency, low operation voltage, thin panel, flexible panel available, easy processing, and the like and the manufacturing technology is gradually mature, accordingly, technologies relating to transparent display devices using AMOLED display panels have been continuously reported. However, when an image displayed from the transparent display device, it tends to be interfered from images of the scene or objects in back of the display device, such that the transparent display device can not clearly display animations, movies, or pictures. As a result, the usage of the transparent display device is limited.

SUMMARY OF THE INVENTION

An object of the present invention is to provide a display device and an operating method of the display device for utilizing the display device relatively widely and variedly.

For the aforesaid object, a display device is provided. The display device includes a transparent display panel and an adjustable light valve. The transparent display panel has a first surface and a second surface disposed opposite to each other. The transparent display panel includes a plurality of pixels for generating an image displayed from the first surface and the second surface. The adjustable light valve is disposed on the second surface of the transparent display panel. The adjustable light valve has a third surface and a fourth surface. The third surface is disposed opposite to the second surface, and the fourth surface is disposed opposite to the third surface. When the display device operates under a transparent display mode, the adjustable light valve is in a transparent status. When the display device operates under a high color saturation display mode, the adjustable light valve is in a non-transparent status.

For the aforesaid object, an operating method of a display device is provided. The method includes steps as follows. First, a display device as described above is provided. Next, an image information signal is input to the transparent display panel. Thereafter, a turn-on signal is input to the adjustable light valve to allow the adjustable light valve to be in a non-transparent status.

For the aforesaid object, an operating method of a display device is provided. The method includes steps as follows. First, a display device as described above is provided. Next, an image information signal is input to the transparent display panel. Thereafter, a turn-off signal is input to the adjustable light valve to allow the adjustable light valve to be in a transparent status.

In the display device according to the present invention, through disposing an adjustable light valve on one side of a transparent display panel, the display modes of the display device may be switched by changing the status of the adjustable light valve. Thereby, when clear animations, movies or pictures are desired, the display device may be set to a high color saturation display mode to avoid the interference from images of the scene or objects in back of the display device. Furthermore, when the visual effect of transparency in combination with the images is desired, the display device can be set to a transparent display mode to present the vision of the combination of the transparency and the images. Thereby, the display device according to the present invention will not be limited to having only a display mode, such as a transparent display mode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
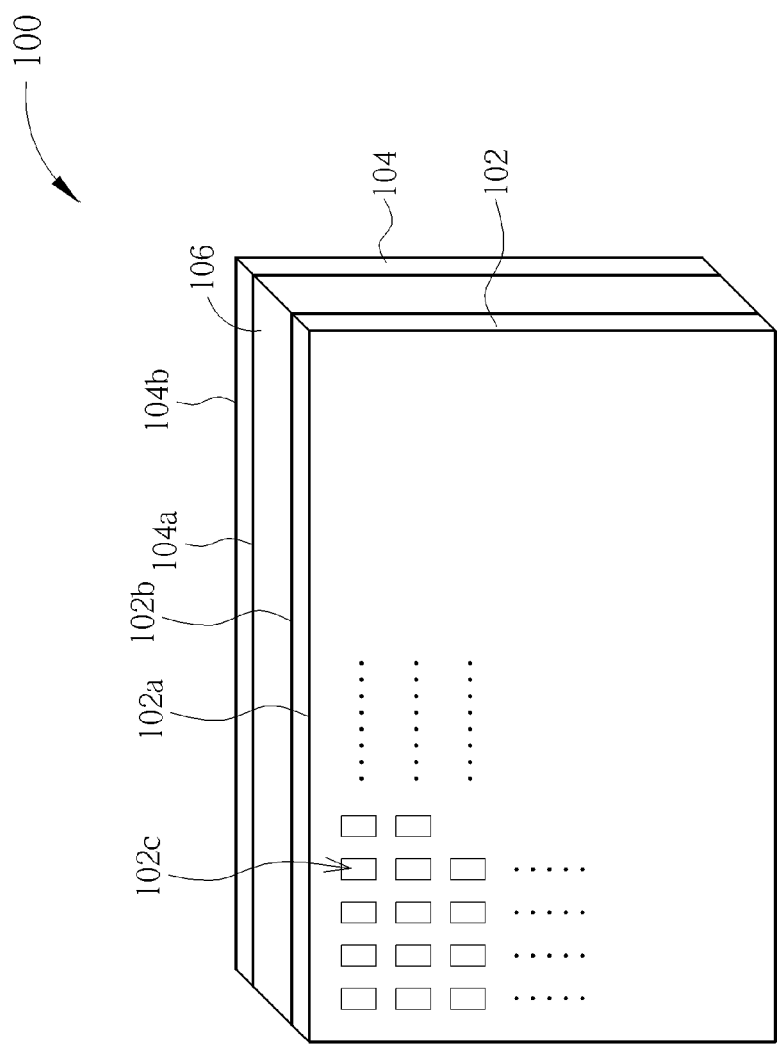
FIG. 1 is a schematic side view illustrating the display device according to the first preferred embodiment of the present invention.

Please refer to FIG. 1. FIG. 1 is a schematic side view illustrating the display device according to the first preferred embodiment of the present invention. As shown in FIG. 1, a display device 100 includes a transparent display panel 102 and an adjustable light valve 104 disposed on the transparent display panel 102. The transparent display panel 102 includes a first surface 102*a* and a second surface 102*b*, and the first surface 102*a* and the second surface 102*b* are disposed opposite to each other. The transparent display panel 102 includes a plurality of pixels 102*c* for generating an image. Because the transparent display panel 102 is in a transparent status in non-displaying regions or when not displaying images, the image generated by the pixels 102c of the transparent display panel 102 may be displayed from both of the first surface 102a and the second surface 102b. In addition, the adjustable light valve 104 has a third surface 104a and a fourth surface 104b. The third surface 104a and the fourth surface 104b are disposed opposite to each other. The adjustable light valve 104 is disposed on the second surface 102b of the transparent display panel 102. The third surface 104a is allowed to face the second surface 102b and to cover the second surface 102b of the transparent display panel 102. When the display device 100 operates under a transparent mode, the adjustable light valve 104 may be in a transparent status. When the display device 100 operates under a high color saturation display mode, the adjustable light valve 104 may be in a non-transparent mode, for example, to render the entire displaying region black. It is worthy to note that when the display device 100 operates under the transparent display mode, the transparent display panel 102 can generate images, and the adjustable light valve 104 is in a transparent status; accordingly, the display device 100 can show the images from the first surface 102a of the transparent display panel 102 and the fourth surface 104b of the adjustable light valve 104 to serve as or become a double-side display device. When the display device 100 operates in a high color saturation display mode, the transparent display panel 102 also generates images; however, the adjustable light valve 104 is in a non-transparent status and totally black. Accordingly, the display device 100 only shows images from the first surface 102a of the transparent display panel 102 to serve as or become a single-side display device. This indicates that the display modes of the display device 100 are allowed to be switched thereamong by changing the status of the adjustable light valve 104, such that, when clear animations, movies or pictures are desired, the display device can be switched to a high color saturation display mode to avoid the interference from images of the scene or objects in back of the display device, so as to display image clearly, and, as well as, when the visual effect of transparency in combination with the images is desired, the display device 100 can be switched to a transparent display mode to present the vision of the combination of the transparency and the images. Thereby, the display device 100 according to this embodiment will not be limited to having only a display mode, i.e. a transparent display mode.

Furthermore, in this embodiment, the display device 100 may include an adhesive layer 106 disposed between the transparent display panel 102 and the adjustable light valve 104 for sticking the second surface 102b of the transparent display panel 102 and the third surface 104a of the adjustable light valve 104 on each other. The adhesive layer 106 according to this embodiment may include for example adhesive material such as an optical adhesive or glue. The second surface 102b of the transparent display panel 102 and the third surface 104a of the adjustable light valve 104 are completely bonded to each other with an adhesive layer 106 therebetween, that is, there is no air bubble therebetween. Thereby, the display device 100 which can be switched between the transparent and the high color saturation display modes will not suffer from display issues caused by air bubbles existing between the transparent display panel 102 and the adjustable light valve 104.

Figure 2:
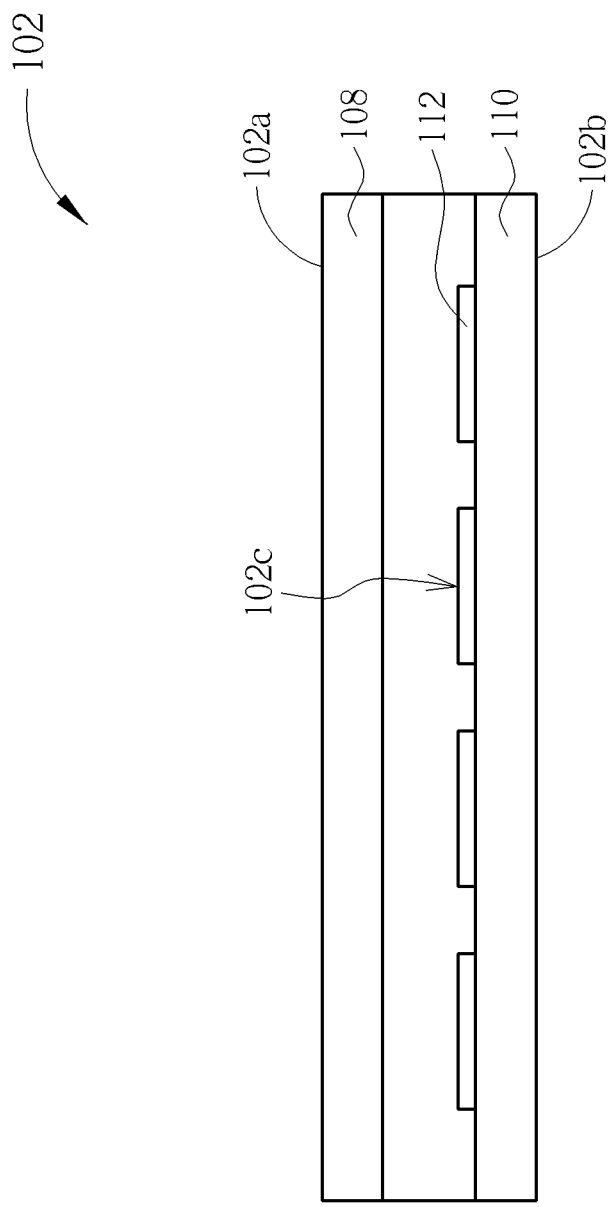
FIG. 2 is a schematic cross-sectional view illustrating the transparent display panel of the display device according to the first preferred embodiment of the present invention.

Please refer to FIG. 2. FIG. 2 is a schematic cross-sectional view illustrating the transparent display panel of the display device according to the first preferred embodiment of the present invention. As shown in FIG. 2, the transparent display panel 102 comprises a first substrate 108, a second substrate 110 and a plurality of organic light-emitting diode device 112. The first substrate 108 and the second substrate 110 are disposed opposite and may include for example transparent substrate material such as glass, plastics, quartz, or the like. The organic light-emitting diode devices 112 are disposed on the second substrate 110 and between the first substrate 108 and the second substrate 110 to serve as the pixels 102c, respectively. In other words, the pixels include active-matrix organic light-emitting diodes. It is worthy to note that the organic light-emitting diode device 112 is in a transparent status when it is not driven, such that the transparent display panel 102 is in a transparent status when no image is generated. The transparent display panel in the present invention is not limited to those described above.

Figure 3:
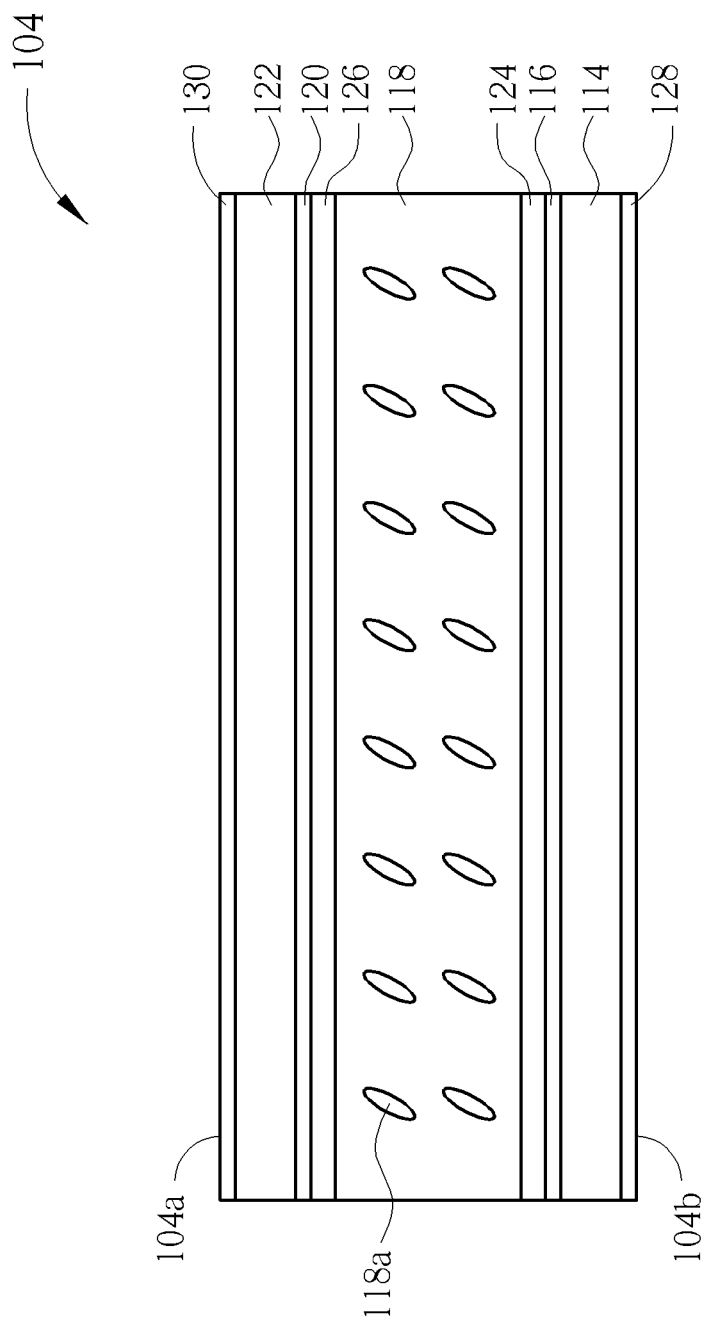
FIG. 3 is a schematic cross-sectional view illustrating the adjustable light valve of the display device according to the first preferred embodiment of the present invention.

Please refer to FIG. 3. FIG. 3 is a schematic cross-sectional view illustrating the adjustable light valve of the display device according to the first preferred embodiment of the present invention. As shown in FIG. 3, the adjustable light valve 104 includes a fourth substrate 114, a lower transparent conductive layer 116, a liquid crystal layer 118, an upper transparent conductive layer 120 and a third substrate 122. The fourth substrate 114 and the third substrate 122 are disposed opposite to each other. The third substrate 122 is disposed between the fourth substrate 114 and the transparent display panel 102. The fourth substrate 114 and the third substrate 122 may include for example transparent substrate material such as glass, plastics, quartz, or the like, so as to allow the adjustable light valve 104 to be in a transparent status. The liquid crystal layer 118 is disposed between the fourth substrate 114 and the third substrate 122 and includes a plurality of liquid crystal molecules 118a. The adjustable light valve 104 in the present invention may be switched to the transparent or the non-transparent status through controlling the rotation of the liquid crystal molecules 118a in the liquid crystal layer 118. The lower transparent conductive layer 116 is disposed on the fourth substrate 114 and between the fourth substrate 114 and the liquid crystal layer 118. The upper transparent conductive layer 120 is disposed on the third substrate 122 and between the third substrate 122 and the liquid crystal layer 118. In this embodiment, the lower transparent conductive layer 116 and the upper transparent conductive layer 120 both overlap the liquid crystal layer 118, so as to allow the liquid crystal molecules 118a in the liquid crystal layer 118 to be controlled to be in a desirable rotation status through adjustment of the voltage difference between the lower transparent conductive layer 116 and the upper transparent conductive layer 120, and, in turn, the adjustable light valve 104 can be switched to be in a transparent or a non-transparent status.

Furthermore, in this embodiment, the adjustable light valve 104 may further include a lower alignment film 124, an upper alignment film 126, a lower polarizer 128, and an upper polarizer 130. The lower alignment film 124 is disposed between the lower transparent conductive layer 116 and the liquid crystal layer 118. The upper alignment film 126 is disposed between the upper transparent conductive layer 120 and the liquid crystal layer 118. Thereby, the liquid crystal molecules 118a in the liquid crystal layer 118 may be aligned to a predetermined direction through the alignment function provided by the lower alignment film 124 and the upper alignment film 126. The lower polarizer 128 is disposed on an outer side of the fourth substrate 114, i.e. one other than the side of the fourth substrate 114 facing the third substrate 122. The upper polarizer 130 is disposed on an outer side of the third substrate 122, i.e. one other than the side of the third substrate 122 facing the fourth substrate 114. In this embodiment, the liquid crystal molecules 118a are twisted nematic (TN)-type liquid crystal molecules, but not limited thereto. The alignment direction of the lower alignment film 124 and the alignment direction of the upper alignment film 126 are perpendicular to each other. The alignment direction of the lower alignment film 124 is the same as the polarization direction of the lower polarizer 128. The polarization direction of the lower polarizer 128 and the polarization direction of the upper polarizer 130 are perpendicular to each other. Thereby, the adjustable light valve 104 is in a transparent status when a voltage difference is applied between the lower transparent conductive layer 116 and the upper transparent conductive layer 120, and the adjustable light valve 104 is in a non-transparent status when no voltage difference is between the lower transparent conductive layer 116 and the upper transparent conductive layer 120. In the present invention, the alignment directions of the lower alignment film and the upper alignment film and the polarization directions of the lower polarizer and the upper polarizer are not limited to those described above and can be adjusted as required or desired so as to allow the adjustable light valve 104 to be in a transparent or non-transparent status according to different driving means.

It is worthy to note that, in this embodiment, the display device 100 may be switched to a display mode through changing the status of the adjustable light valve 104, so as to allow the display device to switched to a high color saturation display mode when clear animations, movies or pictures are desired, to clearly display images, and the interference from images of the scene or objects in back of the display device can be avoided. Furthermore, the display device 100 can be switched to a transparent display mode to present the vision of the combination of the transparency and the images when the visual effect of transparency in combination with the images is desired. Thereby, the display device 100 according to this embodiment will not be limited to having only a display mode, such as a transparent display mode.

The adjustable light valve in the present invention is not limited to those embodiments described above. Other embodiments or modifications will be described hereinafter. For conciseness and comparison among the embodiments or modifications, the same referral numbers or symbols denote the same elements, and the same contents will not be described.

Figure 4:
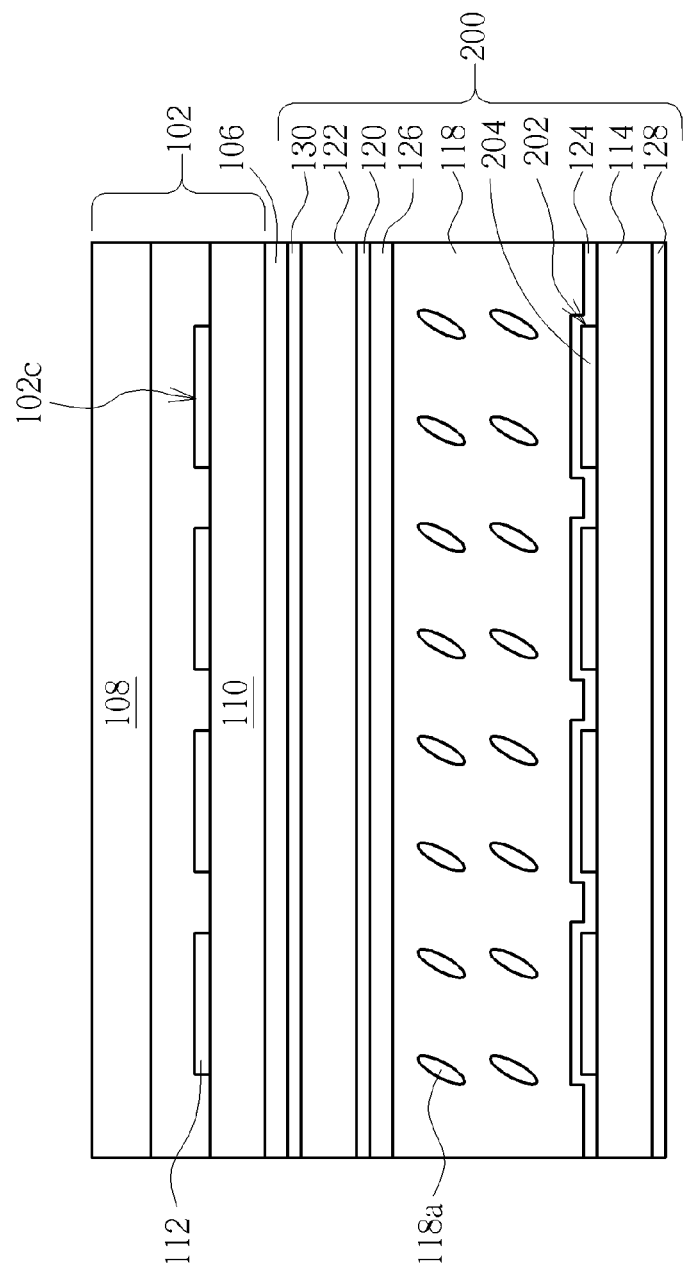
FIG. 4 is a schematic cross-sectional view illustrating the display device according to the second preferred embodiment of the present invention.

Please refer to FIG. 4. FIG. 4 is a schematic cross-sectional view illustrating the display device according to the second preferred embodiment of the present invention. As shown in FIG. 4, in comparison with the first preferred embodiment, in this embodiment, the lower transparent conductive layer of the adjustable light valve 200 includes a lower transparent conductive patterned layer 202. The lower transparent conductive patterned layer 202 includes a plurality of lower transparent electrodes 204 disposed on the fourth substrate 114 and between the fourth substrate 114 and the liquid crystal layer 118. Each lower transparent electrode 204 is disposed corresponding to a pixel 102c of the transparent display panel 102 and overlaps the pixel 102c in a direction perpendicular to the fourth substrate 114. Thereby, when the adjustable light valve 200 is in a non-transparent status, the liquid crystal molecules 118a between the transparent electrode 204 and the upper transparent conductive layer 120 may be rotated to give the non-transparent status, so as to effectively shield the light beam emitted from each pixel 102c, and, in turn, the display device 100 shows an image of high color saturation.

Figure 5:
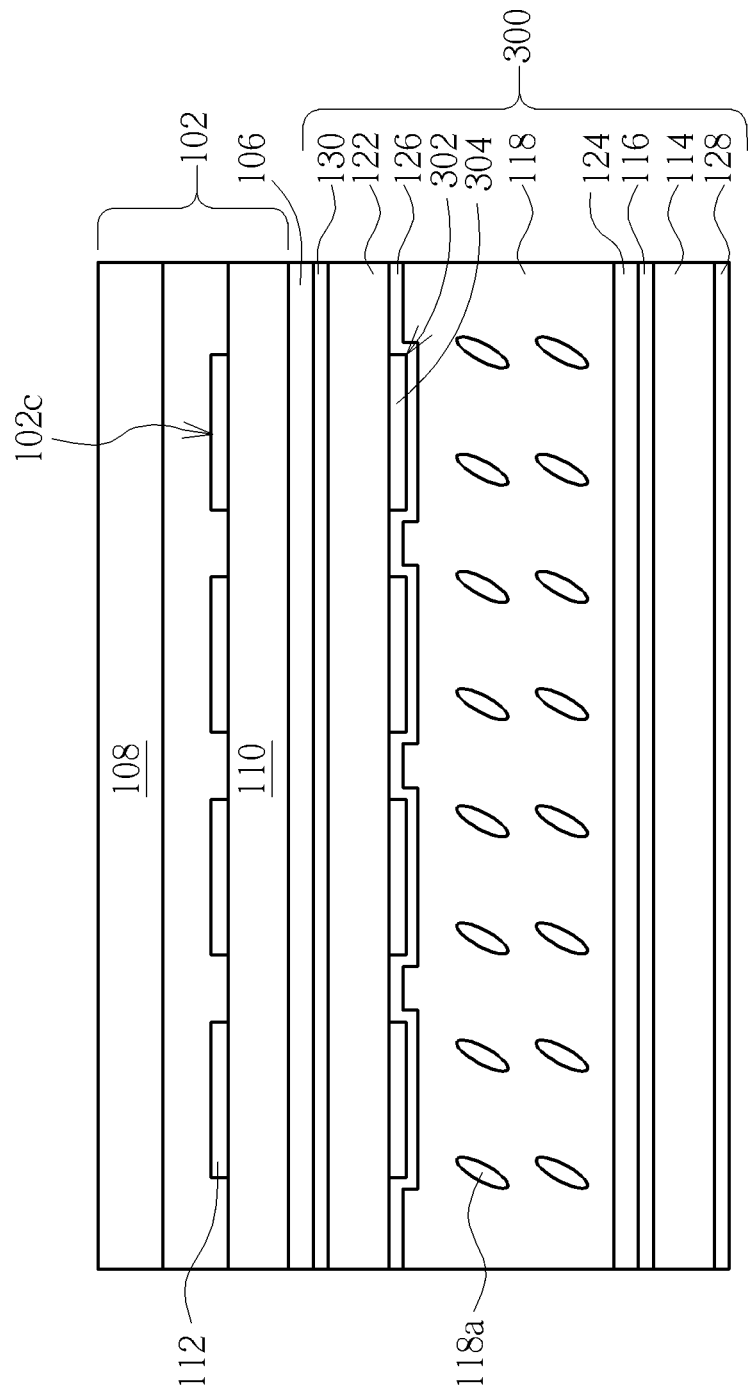
FIG. 5 is a schematic cross-sectional view illustrating the display device according to the third preferred embodiment of the present invention.

Please refer to FIG. 5. FIG. 5 is a schematic cross-sectional view illustrating the display device according to the third preferred embodiment of the present invention. As shown in FIG. 5, in comparison with the first preferred embodiment, in this embodiment, the upper transparent conductive layer of the adjustable light valve 300 includes an upper transparent conductive patterned layer 302. The upper transparent conductive patterned layer 302 includes a plurality of upper transparent electrodes 304 disposed on the third substrate 122 and between the third substrate 122 and the liquid crystal layer 118. Each upper transparent electrode 304 is disposed corresponding to a pixel 102c of the transparent display panel 102 and overlaps the pixel 102c in a direction perpendicular to the third substrate 122.

Figure 6:
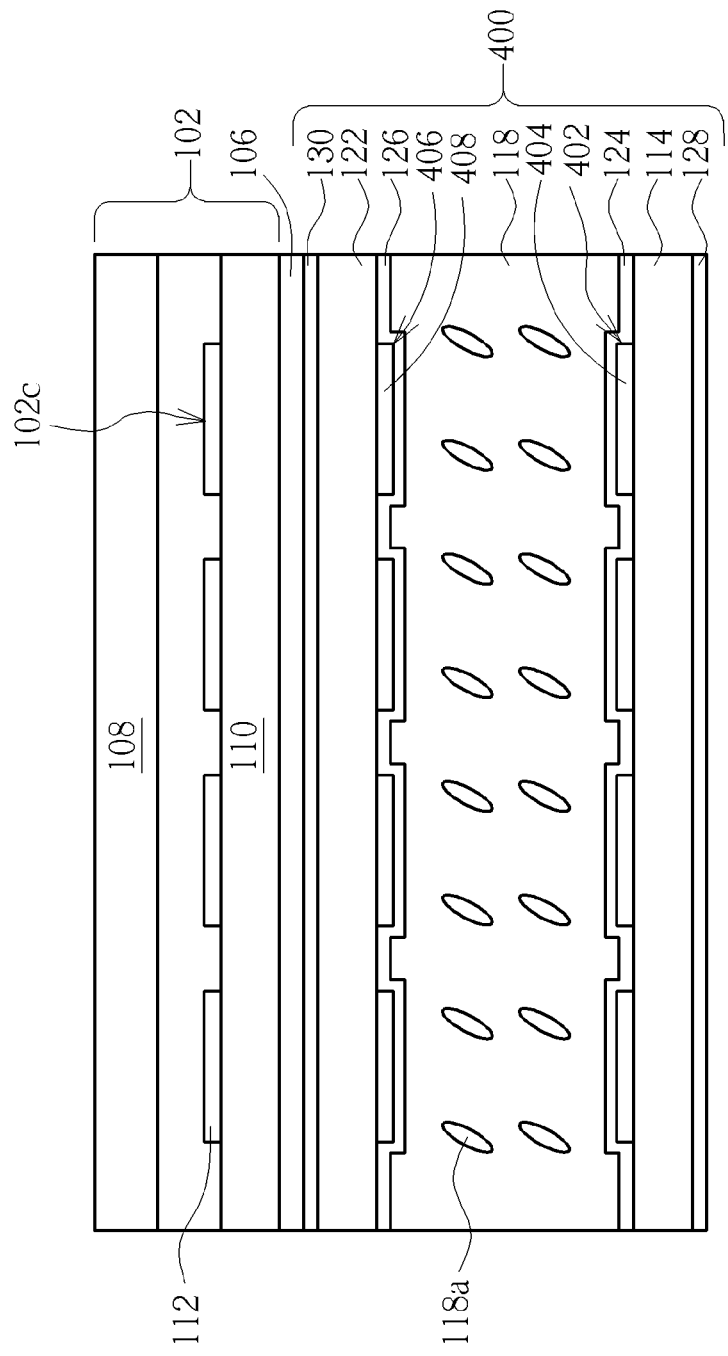
FIG. 6 is a schematic cross-sectional view illustrating the display device according to the fourth preferred embodiment of the present invention.

Please refer to FIG. 6. FIG. 6 is a schematic cross-sectional view illustrating the display device according to the fourth preferred embodiment of the present invention. As shown in FIG. 6, in comparison with the first preferred embodiment, in this embodiment, the lower transparent conductive layer of the adjustable light valve 400 includes a lower transparent conductive patterned layer 402 including a plurality of lower transparent electrodes 404; and the upper transparent conductive layer of the adjustable light valve 400 includes an upper transparent conductive patterned layer 406 including a plurality of upper transparent electrodes 408. The lower transparent electrodes 404 are disposed on the fourth substrate 114 and between the fourth substrate 114 and the liquid crystal layer 118. Each lower transparent electrode 404 is disposed corresponding to a pixel 102c of the transparent display panel 102 and overlaps the pixel 102c in a direction perpendicular to the fourth substrate 114. The upper transparent electrodes 408 are disposed on the third substrate 122 and between the third substrate 122 and the liquid crystal layer 118. Each upper transparent electrode 408 is disposed corresponding to a pixel 102c of the transparent display panel 102 and overlaps the pixel 102c in a direction perpendicular to the third substrate 122.

Figure 7:
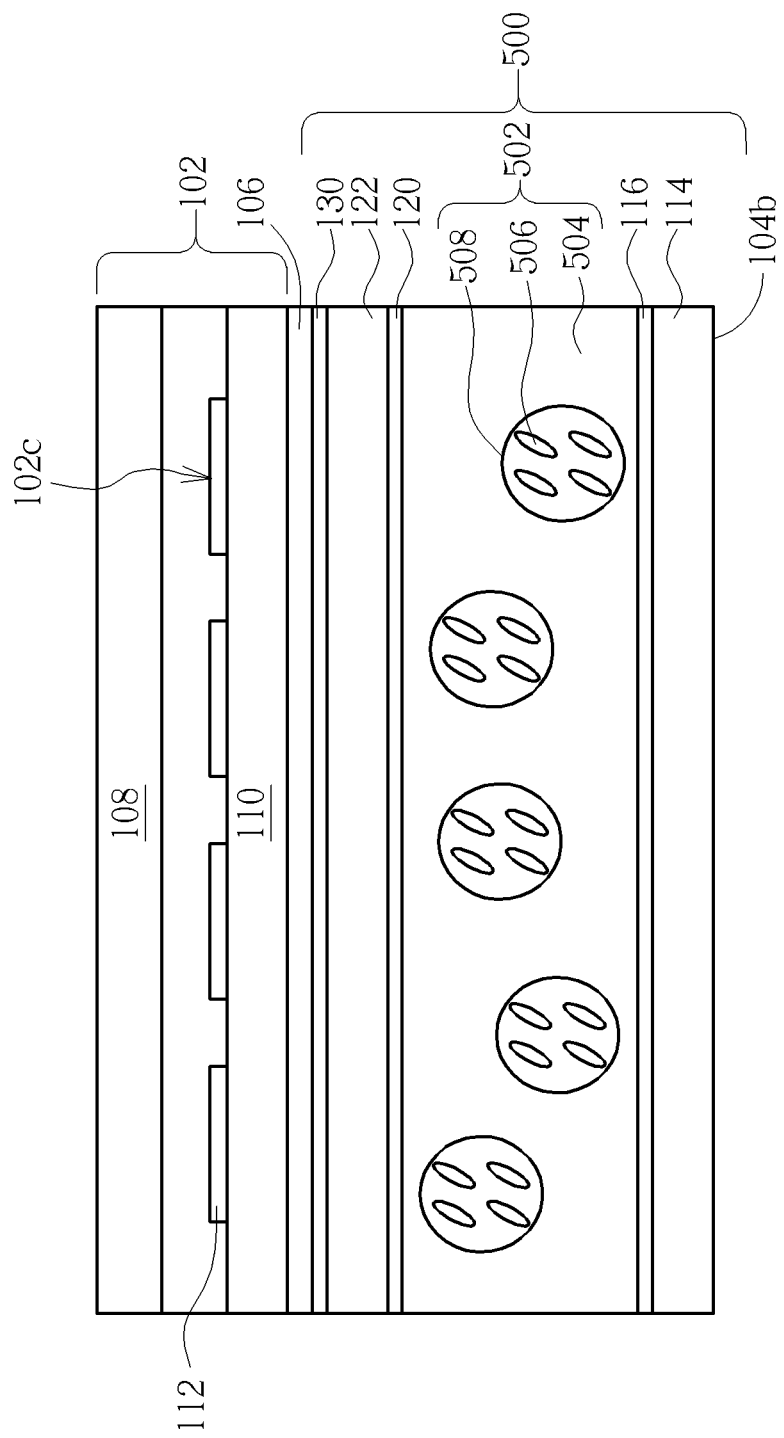
FIG. 7 is a schematic cross-sectional view illustrating the display device according to the fifth preferred embodiment of the present invention.

Please refer to FIG. 7. FIG. 7 is a schematic cross-sectional view illustrating the display device according to the fifth preferred embodiment of the present invention. As shown in FIG. 7, in comparison with the first preferred embodiment, in this embodiment, the liquid crystal layer 502 of the adjustable light valve 500 is a layer of polymer dispersed liquid crystal, that is, the liquid crystal layer 502 includes a polymeric material layer 504 and a plurality of liquid crystal molecules 506, and the liquid crystal molecules 506 are formed into a plurality of liquid crystal spheres 508 which disperse in the polymeric material layer 504. Accordingly, in this embodiment, the lower alignment film, the upper alignment film, the lower polarizer and the upper polarizer are not needed for the adjustable light valve 500. Furthermore, the adjustable light valve 500 can be in a transparent or non-transparent status controlled through the rotation of the liquid crystal molecules 506 of the liquid crystal sphere 508 driven by the lower transparent conductive layer 116 and the upper transparent conductive layer 120. In this embodiment, when there is no voltage difference between the lower transparent conductive layer 116 and the upper transparent conductive layer 120, the liquid crystal molecules 506 in the liquid crystal spheres 508 are arranged in random and in disorder. Accordingly, the images emitted from the transparent display panel 102 and incident into the liquid crystal layer 502 will be scattered in different directions and can not be displayed from the fourth surface 104b of the adjustable light valve 500. When a voltage difference is applied between the lower transparent conductive layer 116 and the upper transparent conductive layer 120, the liquid crystal molecules 506 in the liquid crystal spheres 508 are arranged in order to allow a light beam to pass through. Accordingly, the images emitted from the transparent display panel 102 and incident into the liquid crystal layer 502 can pass through the liquid crystal layer 502 and be displayed from the fourth surface 104b of the adjustable light valve 500. In other embodiments, when the liquid crystal layer is a polymer dispersed liquid crystal layer, at least one of the lower transparent conductive layer and the upper transparent conductive layer may be also the transparent conductive patterned layer.

Figure 8:
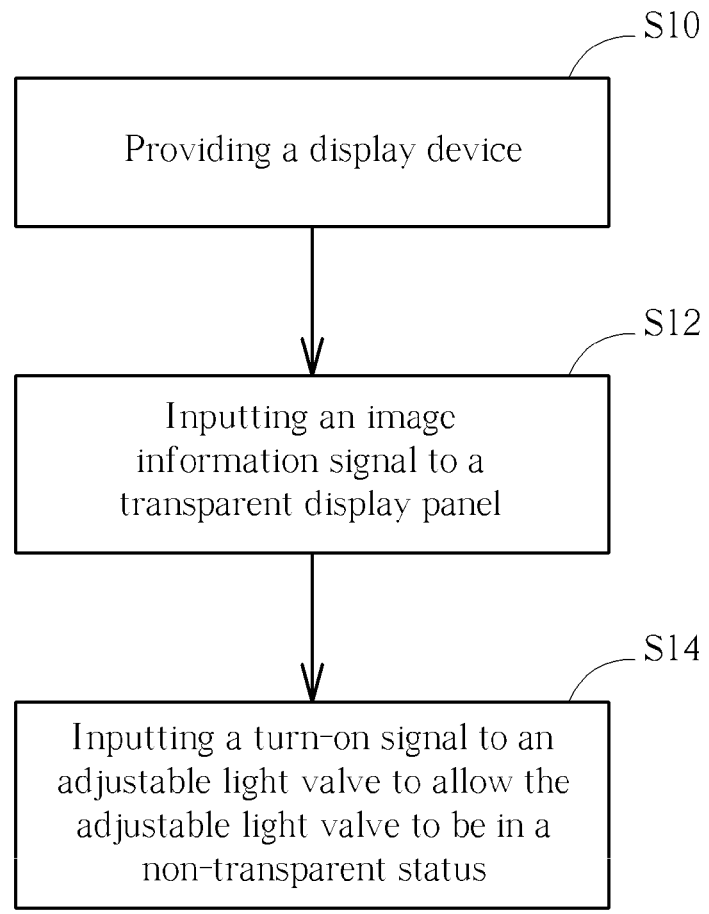
FIG. 8 is a flow chart illustrating the operation method of the display device according to the first preferred embodiment of the present invention under a high color saturation display mode.

According to the display devices in the aforesaid embodiments, an operation method to switch a display device to a non-transparent status is provided. Please refer to FIGS. 1, 2, 3, and 8. FIG. 8 is a flow chart illustrating the operation method of the display device according to the first preferred embodiment of the present invention to switch to a high color saturation display mode. As shown in FIGS. 1, 2, 3, and 8, the operation method of a display device according to this embodiment includes steps as follows.

Step S10: providing a display device;

Step S12: inputting an image information signal to the transparent display panel 102; and Step S14: inputting a turn-on signal to the adjustable light valve 104 to allow the adjustable light valve 104 to be in a non-transparent status.

In Step S10, the display device according to this embodiment is described by taking the first preferred embodiment as an example, but the present invention is not limited thereto and may be one of the aforesaid embodiments. In Step S12, when an image information signal is input into the transparent display panel 102, the first surface 102a and the second surface 102b of the transparent display panel 102 may display an image. The image information signal may be one of, for example, movie, picture, or animation and can be generated by an image player or image signal source and be transmitted through an image signal line to the transparent display panel 102. In Step S14, the turn-on signal is generated by applying a voltage difference between the lower transparent conductive layer 116 and the upper transparent conductive layer 120 of the adjustable light valve 104, so as to allow the adjustable light valve 104 to be in a non-transparent status, such that, the display device 100 can display an image from the first surface 102a to serve as a single-side display device and operate under a high color saturation display mode. In other embodiments, before or after Step S14, a turn-off signal may be input into the adjustable light valve to allow the adjustable light valve to be in a transparent status. Alternatively, when the adjustable light valve is the adjustable light valve in the fifth preferred embodiment, the turn-on signal may be the turn-off signal.

Figure 9:
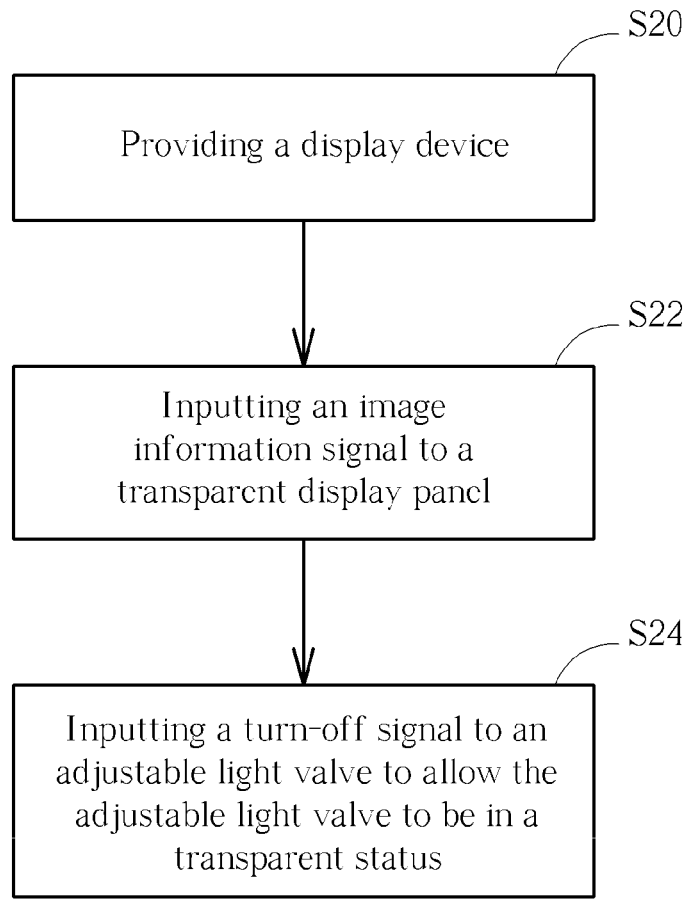
FIG. 9 is a flow chart illustrating the operation method of the display device according to the first preferred embodiment of the present invention under a transparent mode.

According to the display devices in the aforesaid embodiments, an operation method to switch a display device to a transparent status is provided. Please refer to FIGS. 1, 2, 3, and 9. FIG. 9 is a flow chart illustrating the operation method of the display device according to the first preferred embodiment of the present invention to switch to a transparent display mode. As shown in FIGS. 1, 2, 3, and 9, the operation method of a display device according to this embodiment includes steps as follows.

Step S20: providing a display device;

Step S22: inputting an image information signal to the transparent display panel 102; and Step S24: inputting a turn-on signal to the adjustable light valve 104 to allow the adjustable light valve 104 to be in a transparent status.

In Step S20, the display device according to this embodiment is described by taking the first preferred embodiment as an example, but the present invention is not limited thereto and may be one of the aforesaid embodiments. In Step S22, when an image information signal is input into the transparent display panel 102, the first surface 102a and the second surface 102b of the transparent display panel 102 may display an image. The image information signal may be one of, for example, movie, picture, photograph or animation and can be generated by an image player or image signal source and be transmitted through an image signal line to the transparent display panel 102. In Step S24, the turn-off signal is generated by removing the voltage difference between the lower transparent conductive layer 116 and the upper transparent conductive layer 120 of the adjustable light valve 104, i.e. no voltage difference is applied, so as to allow the adjustable light valve 104 to be in a transparent status, such that, the display device 100 can display an image from the first surface 102a and the fourth surface 104b to serve as a double-side display device and operate under a transparent display mode. In other embodiments, before or after Step S24, a turn-on signal may be input into the adjustable light valve to allow the adjustable light valve to be in a non-transparent status. Alternatively, when the adjustable light valve is the adjustable light valve in the fifth preferred embodiment, the turn-off signal may be the turn-on signal.

In conclusion, in the display device according to the present invention, the display modes of the display device is allowed to be switched thereamong by changing the status of the adjustable light valve through disposition of an adjustable light valve on one side of a transparent display panel. Thereby, when clear animations, movies, or pictures are desired, the display device may be set to a high color saturation display mode to avoid the interference from images of the scene or objects in back of the display device. Furthermore, when the visual effect of transparency in combination with the images is desired, the display device can be switched to a transparent display mode to present the vision of the combination of the transparency and the images. Thereby, the display device according to the present invention can have other display mode in addition to a transparent display mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device, comprising:
a transparent display panel having a plurality of pixels comprising active-matrix organic light-emitting diodes, wherein the transparent display panel comprises:
a first substrate having a first surface; and
a second substrate having a second surface disposed opposite to the first surface; and
an adjustable light valve disposed on the transparent display panel, the adjustable light valve comprising:
a third substrate having a third surface;
a fourth substrate having a fourth surface, wherein the third substrate is disposed between the fourth substrate and the transparent display panel, and the third surface is disposed correspondingly to the second surface of the transparent display panel;
a liquid crystal layer disposed between the third substrate and the fourth substrate;
an upper transparent conductive layer disposed between the third substrate and the liquid crystal layer; and
a lower transparent conductive layer disposed between the fourth substrate and the liquid crystal layer, wherein the lower transparent conductive layer and the upper transparent conductive layer cover the liquid crystal layer in a direction perpendicular to the third surface.

2. The display device of claim 1, wherein the pixels are disposed on the second substrate and between the first substrate and the second substrate.

3. The display device of claim 1, wherein, the adjustable light valve further comprises:
a lower alignment film disposed between the fourth substrate and the liquid crystal layer; and
an upper alignment film disposed between the third substrate and the liquid crystal layer.

4. The display device of claim 1, wherein, the adjustable light valve further comprises:
a lower polarizer disposed on an outer side of the fourth substrate; and
an upper polarizer disposed between the third substrate and the transparent display panel.

5. The display device of claim 1, wherein, the liquid crystal layer comprises a polymeric material layer and a plurality of liquid crystal spheres dispersed in the polymeric material layer.

6. The display device of claim 1, further comprising an adhesive layer disposed between the transparent display panel and the adjustable light valve, for sticking the second surface and the third surface on each other.

7. An operating method of a display device, comprising:
providing a display device as recited in claim 1;
inputting an image information signal to the transparent display panel; and
inputting a turn-on signal to the adjustable light valve to allow the adjustable light valve to be in a non-transparent status.

8. The operating method of claim 7, wherein, when the turn-on signal is input to the adjustable light valve, the display device serves as a single-side display device.

9. The operating method of claim 7, wherein, when the turn-on signal is input to the adjustable light valve, an image is displayed from the transparent display panel.

10. The operating method of claim 7, wherein, when the turn-on signal is input to the adjustable light valve, the display device operates under a high color saturation display mode.

11. An operating method of a display device, comprising:
providing a display device as recited in claim 1;
inputting an image information signal to the transparent display panel; and
inputting a turn-off signal to the adjustable light valve to allow the adjustable light valve to be in a transparent status.

12. The operating method of claim 11, wherein, when the turn-off signal is input to the adjustable light valve, the display device serves as a double-side display device.

13. The operating method of claim 11, wherein, when the turn-off signal is input to the adjustable light valve, an image is displayed from the transparent display panel and the adjustable light valve.

14. The operating method of claim 11, wherein, when the turn-off signal is input to the adjustable light valve, the display device operates under a transparent display mode.

15. A display device, comprising:
a transparent display panel having a plurality of pixels comprising active-matrix organic light-emitting diodes, wherein the transparent display panel comprises:
a first substrate having a first surface; and
a second substrate having a second surface disposed opposite to the first surface; and
an adjustable light valve disposed on the transparent display panel, the adjustable light valve comprising:
a third substrate having a third surface;
a fourth substrate having a fourth surface, wherein the third substrate is disposed between the fourth substrate and the transparent display panel, and the third surface is disposed correspondingly to the second surface of the transparent display panel;
a liquid crystal layer disposed between the third substrate and the fourth substrate;
an upper transparent conductive layer disposed between the third substrate and the liquid crystal layer, wherein the upper transparent conductive layer comprises an upper transparent conductive patterned layer comprising a plurality of upper transparent electrodes overlapping the pixels respectively; and
a lower transparent conductive layer disposed between the fourth substrate and the liquid crystal layer.

16. The display device of claim 15, wherein the lower transparent conductive layer comprises a lower transparent conductive patterned layer comprising a plurality of lower transparent electrodes overlapping the pixels respectively.

* * * * *